United States Patent
Im

(10) Patent No.: US 9,153,511 B2
(45) Date of Patent: Oct. 6, 2015

(54) CHIP ON FILM INCLUDING DIFFERENT WIRING PATTERN, FLEXIBLE DISPLAY DEVICE INCLUDING THE SAME, AND METHOD OF MANUFACTURING FLEXIBLE DISPLAY DEVICE

(71) Applicant: Samsung Display Co., Ltd., Yongin, Gyeonggi-do (KR)

(72) Inventor: Dae-Hyuk Im, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 71 days.

(21) Appl. No.: 14/038,559

(22) Filed: Sep. 26, 2013

(65) Prior Publication Data

US 2014/0332770 A1    Nov. 13, 2014

(30) Foreign Application Priority Data

May 9, 2013    (KR) .......................... 10-2013-0052723

(51) Int. Cl.
| | |
|---|---|
| H01L 29/08 | (2006.01) |
| H01L 35/24 | (2006.01) |
| H01L 51/00 | (2006.01) |
| H01L 23/12 | (2006.01) |
| H01L 25/16 | (2006.01) |
| H01L 25/00 | (2006.01) |
| H01L 23/14 | (2006.01) |
| H01L 23/498 | (2006.01) |

(52) U.S. Cl.
CPC .............. *H01L 23/12* (2013.01); *H01L 25/167* (2013.01); *H01L 25/50* (2013.01); *H01L 23/145* (2013.01); *H01L 23/4985* (2013.01); *H01L 23/49894* (2013.01); *H01L 2924/0002* (2013.01)

(58) Field of Classification Search
USPC ...................... 257/40, 41, 81, 82, 91, 99, 620, 257/666–677, E23.031–E23.059, 527, 594, 257/618, 622, 88, 642–643, 759, 57, 59, 72, 257/83, 257, 290, 351, 368, 392; 438/63, 438/113, 114, 458, 460–465, 33, 68, 107, 438/29, 69, 82, 28, 99
See application file for complete search history.

(56) References Cited

U.S. PATENT DOCUMENTS

2008/0062373 A1 *   3/2008   Kim et al. ..................... 349/151

FOREIGN PATENT DOCUMENTS

| KR | 10-2003-0006202 A | 1/2003 |
| KR | 10-0654338 B1 | 11/2006 |

\* cited by examiner

*Primary Examiner* — Dao H Nguyen
*Assistant Examiner* — Tram H Nguyen
(74) *Attorney, Agent, or Firm* — Knobbe, Martens, Olson & Bear, LLP

(57) ABSTRACT

A chip on film for a flexible display device is disclosed. In one aspect, the chip on film includes a base film, a semiconductor chip provided to the base film, and a wire part provided to the base film and electrically connected to the semiconductor chip. The wire part includes a first region and a second region connected to the first region, and a first interval between the wires disposed at an outermost of the first region is different from a second interval between the wires disposed at an outermost area of the second region.

20 Claims, 4 Drawing Sheets

CHIP ON FILM INCLUDING DIFFERENT WIRING PATTERN, FLEXIBLE DISPLAY DEVICE INCLUDING THE SAME, AND METHOD OF MANUFACTURING FLEXIBLE DISPLAY DEVICE

CROSS-REFERENCE TO RELATED APPLICATIONS

This application claims priority to and the benefit of Korean Patent Application No. 10-2013-0052723 filed in the Korean Intellectual Property Office on May 9, 2013, the entire contents of which are incorporated herein by reference.

BACKGROUND

1. Field

The described technology generally relates to a chip on film used in a flexible display device, a flexible display device including the same, and a manufacturing method thereof.

2. Description of the Related Technology

In a flexible display device, a display panel and a flexible printed circuit (FPC) are generally electrically connected by using a chip on film (COF) as a driving chip (a driving IC) element.

In general, the chip on film includes a semiconductor chip formed with an electrode bump and a wire substrate to which the semiconductor chip is bonded via the electrode bump.

The wire substrate includes a base film, a wire formed on one surface of the base film, and a solder resist covering and protecting the wire.

One end of the wire is electrically connected to the semiconductor chip through the electrode bump, and the other end is exposed outside the solder resist.

The above information disclosed in this Background section is only for enhancement of understanding of the background of the described technology and therefore it may contain information that does not constitute the prior art that is already known in this country to a person of ordinary skill in the art.

SUMMARY OF CERTAIN INVENTIVE ASPECTS

One inventive aspect is a chip on film that is flexibly and electrically connected to a display panel without a limitation of a size of the display panel.

Another aspect is a flexible display device including the chip on film, and a manufacturing method thereof.

A chip on film according to an exemplary embodiment includes a base film, a semiconductor chip provided to the base film, and a wire part provided to the base film and electrically connected to the semiconductor chip.

The wire part includes a first region and a second region connected to the first region, and a first interval between wires disposed at an outermost area of the first region is different from a second interval between wires disposed at an outermost area of the second region.

The second interval may be larger than the first interval.

The wire of the first region may be disposed in plural with a third interval, the wire of the second region may be disposed in plural with a fourth interval, and the fourth interval may be larger than the third interval.

A cutting line may be formed between the first region and the second region, and the cutting line may be formed of a straight line passing a wire end of the first region.

A flexible display device according to another exemplary embodiment includes a display panel, and the above-described chip on film electrically connected to the display panel.

The display panel may include a pad part electrically connected to the wire part of the chip on film, and the pad part may be electrically connected to the wire of the second region.

The display panel may be an organic light emitting display panel or a liquid crystal display panel.

Another aspect is a manufacturing method of a flexible display device including electrically connecting a chip on film to the display panel, the chip on film includes: a base film; a semiconductor chip provided to the base film; and a wire part provided to the base film and electrically connected to the semiconductor chip, wherein the wire part includes a first region and a second region connected to the first region, a first interval between wires disposed at an outermost area of the first region is different from a second interval between wires disposed at an outermost area of the second region, the display panel includes a pad part electrically connected to a wire part of the chip on film, and the pad part is selectively connected to one wire of the wire of the first region and the wire of the second region by corresponding to the pad part.

When the pad part is formed in plural with a sixth interval at the display panel, the wire of the first region is formed in plural with a third interval, and the sixth interval corresponds to the third interval, the base film may be cut according to a cutting line formed between the first region and the second region, and the pad part and the wire of the first region may be electrically connected.

When the pad part is formed in plural with a fifth interval at the display panel, the wire of the second region is formed in plural with a fourth interval, and the fifth interval corresponds to the fourth interval, the base film may not be cut according to a cutting line formed between the first region and the second region, and the pad part and the wire of the second region may be electrically connected.

At least two wire regions are designed at one chip on film, and when electrically connecting the pad part of the display panel and the wire of the chip on film, the pad part may be selectively connected to one region among a plurality of wire regions according to the size of the display panel.

According to at least one of the disclosed embodiments, the chip on film may correspond to a size change of the display panel.

That is, compared with a typical chip on film (not necessarily prior art), a usage range of the display panel may be increased.

Furthermore, although the pad part of the panel and the chip on film is not normally aligned by self deviation of the display panel and the chip on film when electrically connecting the chip on film to the display panel, the chip on film according to an exemplary embodiment is not entirely discarded and is partially cut to normally align the pad part of the panel and the wire part of the chip on film, thereby preventing a cost increase according to the raw material loss.

Moreover, it is not necessary to replace a film reel of the chip on film corresponding to the pad size of the flexible panel such that a reel replacement time is not generated, thereby efficiently maintaining the equipment operation time.

DETAILED DESCRIPTION OF CERTAIN INVENTIVE EMBODIMENTS

Figure 1:
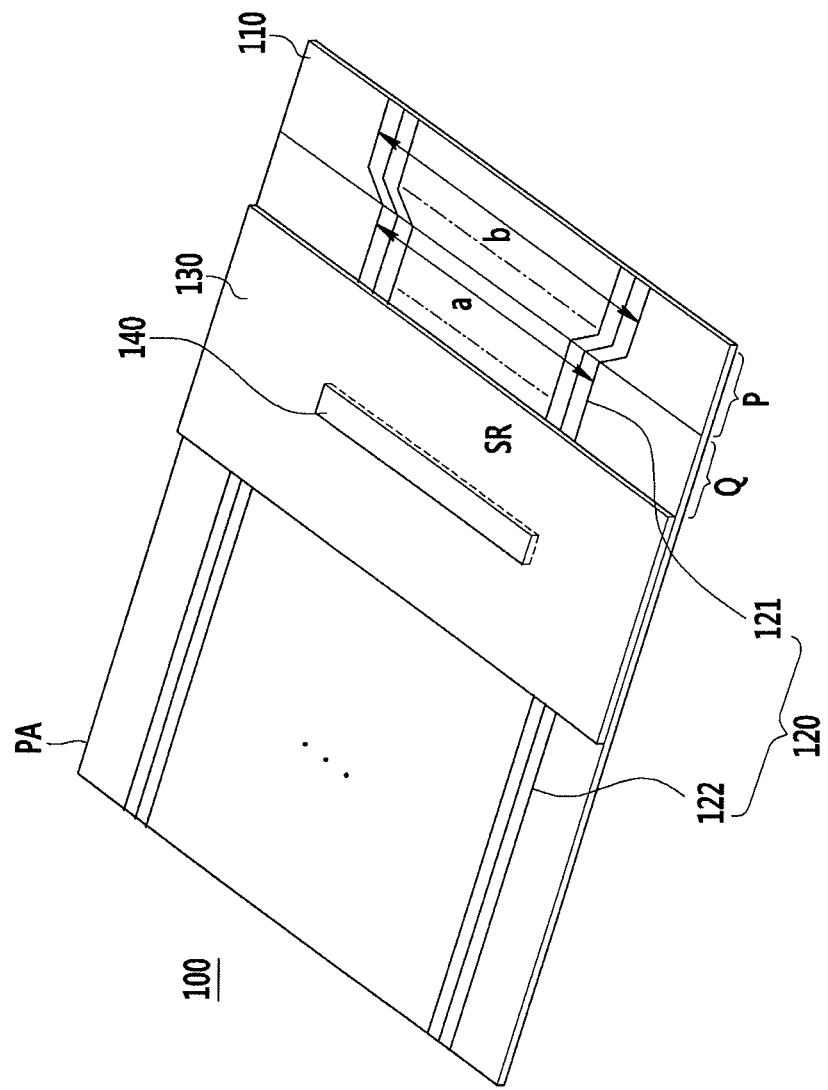
FIG. 1 is a perspective view of a chip on film according to an exemplary embodiment.

Embodiments will be described more fully hereinafter with reference to the accompanying drawings.

As those skilled in the art would realize, the described embodiments may be modified in various different ways, all without departing from the spirit or scope of the described technology.

The drawings and description are to be regarded as illustrative in nature and not restrictive. Like reference numerals designate like elements throughout the specification.

The size and thickness of the components shown the drawings are optionally determined for better understanding and ease of description, and the present invention is not limited to the examples shown in the drawings.

Throughout this specification and the claims which follow, unless explicitly described to the contrary, the word "comprising" and variations such as "comprises" will be understood to imply the inclusion of stated elements but not the exclusion of any other elements.

Throughout the specification, it will be understood that when an element such as a layer, film, region, area or panel is referred to as being "on" another element, it can be directly on the other element or intervening elements may also be present.

Throughout this specification, it is understood that the term "on" and similar terms are used generally and are not necessarily related to a gravitational reference.

Figure 2:
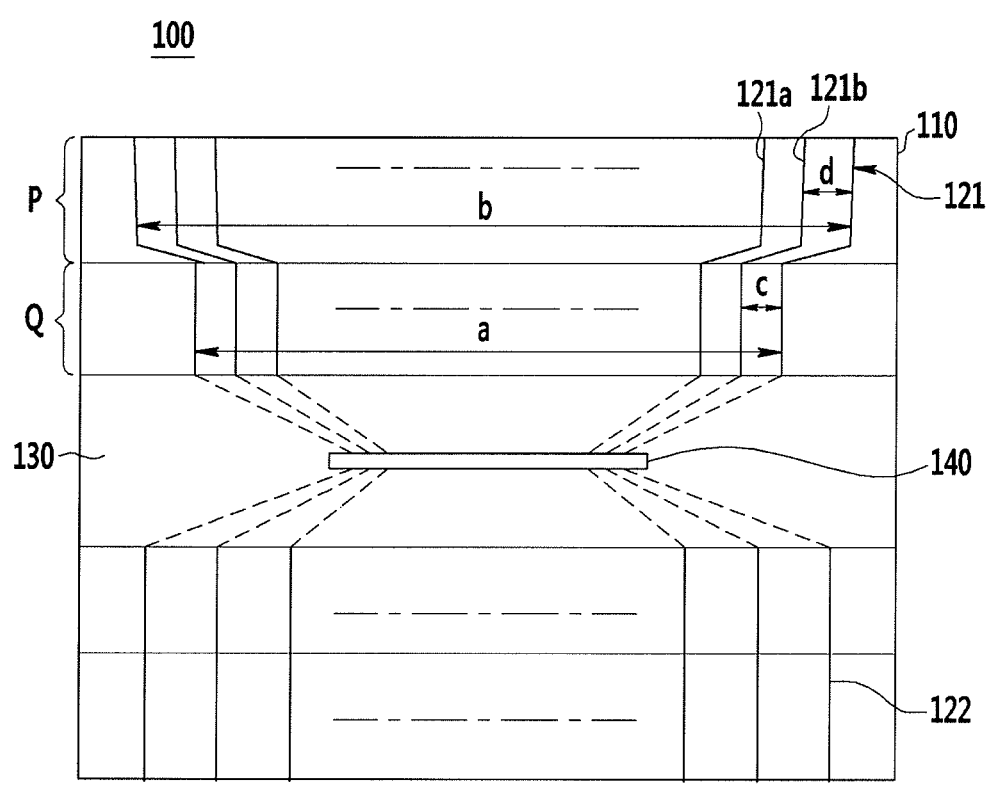
FIG. 2 is a top plan view of a chip on film according to an exemplary embodiment.

FIG. 1 is a perspective view of a chip on film according to an exemplary embodiment, and FIG. 2 is a top plan view of a chip on film according to an exemplary embodiment.

Referring to FIG. 1 and FIG. 2, a chip on film 100 of an exemplary embodiment includes a base film 110, a semiconductor chip 140 provided to the base film 110, a wire part 120 provided to the base film 110 and electrically connected to the semiconductor chip 140, and a solder resist 130 covering and protecting a remaining part except for an end of the wire part 120.

The semiconductor chip 140 of the chip on film according to the present invention is bonded to an upper surface of the base film 110 through, for example, an electrode bump (not shown) that is formed at an edge part of an active surface by a flip chip type.

A part on which the semiconductor chip 140 is bonded is protected from the external environment by a resin layer that is filled as an underfill type.

The resin layer has a function of suppressing a defect due to a difference in thermal expansion coefficients between the semiconductor chip 140 and the base film 110.

In some embodiments, the base film 110 is formed of a polymer film such as a polyimide, and includes sprocket holes (not shown) formed ay predetermined intervals according to both edges of the base film 110.

The semiconductor chip 140 may be disposed substantially perpendicular to a direction that the sprocket holes are arranged.

In some embodiments, when the chip on film 100 is used in a flexible display device, the edge part of the base film 110 in which the sprocket holes are formed is removed and only a package area PA is used.

An input wire part 122 is positioned at one side of the semiconductor chip 140, and an output wire part 121 is positioned at the other side of the semiconductor chip 140.

The input wire part 122 and the output wire part 121 may be formed substantially parallel to the direction that the sprocket holes are disposed.

The wire part 120 may be formed of a copper wire plated with gold or tin.

One end of the input wire part 122 is connected to the electrode bump and an opposite end thereof is positioned along the edge of one side of the package area PA.

One end of the output wire part 121 is connected with the electrode bump, and an opposite end of the output wire part 121 is positioned along an edge of the other side of the package area PA.

The input wire part 122 is connected to pad parts of the flexible printed circuit (FPC) later, and the output wire part 121 is connected to pad parts of the display panel later.

The output wire part 121 includes a plurality of wires 121a and 121b.

The solder resist 130, which is an insulation protective layer, covers and protects the regions other than the ends of the input wire part 122 and the output wire part 121.

The wire part 120 includes a first region Q and a second region P connected to the first region, and a first interval a between the wires disposed at an outermost area of the first region Q is different from a second interval b between the wires disposed at the outermost area of the second region P. The first interval a may be the distance between two wires that have the greatest distance among the wires located in the first region Q as shown in FIG. 2. The second interval b may be the distance between two wires that have the greatest distance among the wires located in the second region P as shown in FIG. 2.

The second interval b may be larger than the first interval a.

Also, the wires of the first region Q are disposed in plural with a third interval c, the wires of the second region P are disposed in plural with a fourth interval d, and the fourth interval d may be generally larger than the third interval c.

Here, a cutting line is formed between the first region Q and the second region P, and the cutting line is a substantially straight line passing a wire end of the first region Q.

Figure 3:
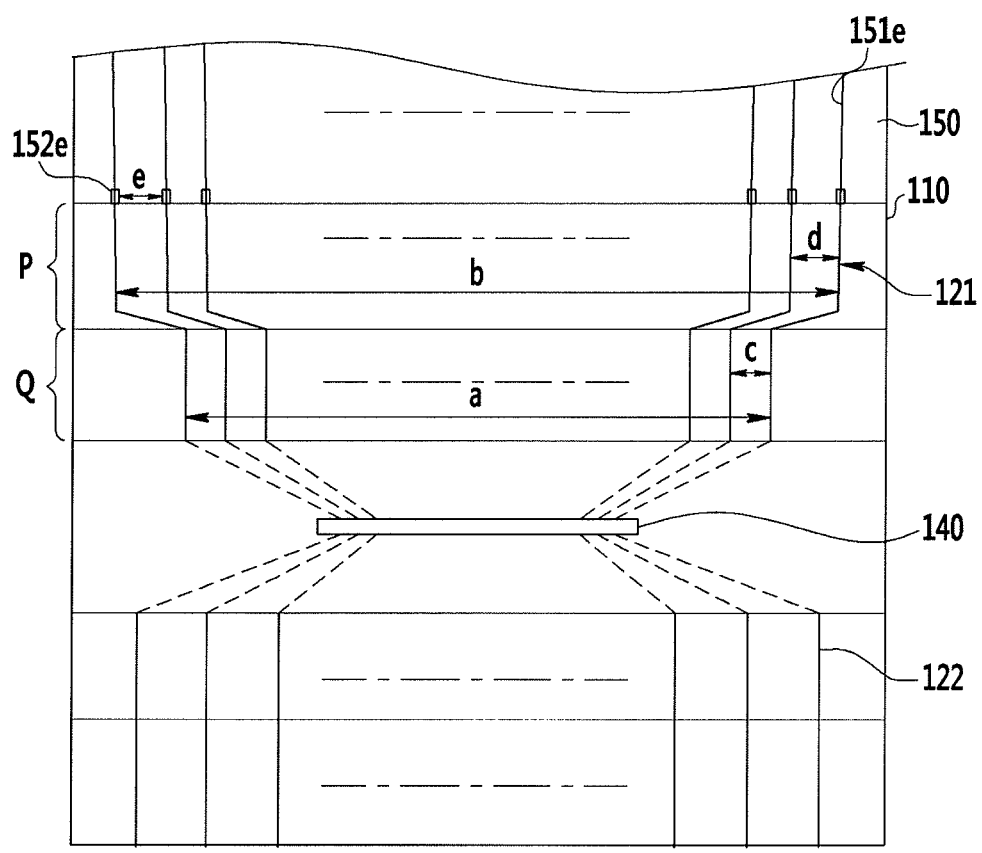
FIG. 3 is a top plan view of a chip on film bonded to a display panel according to a first exemplary embodiment.
Figure 4:
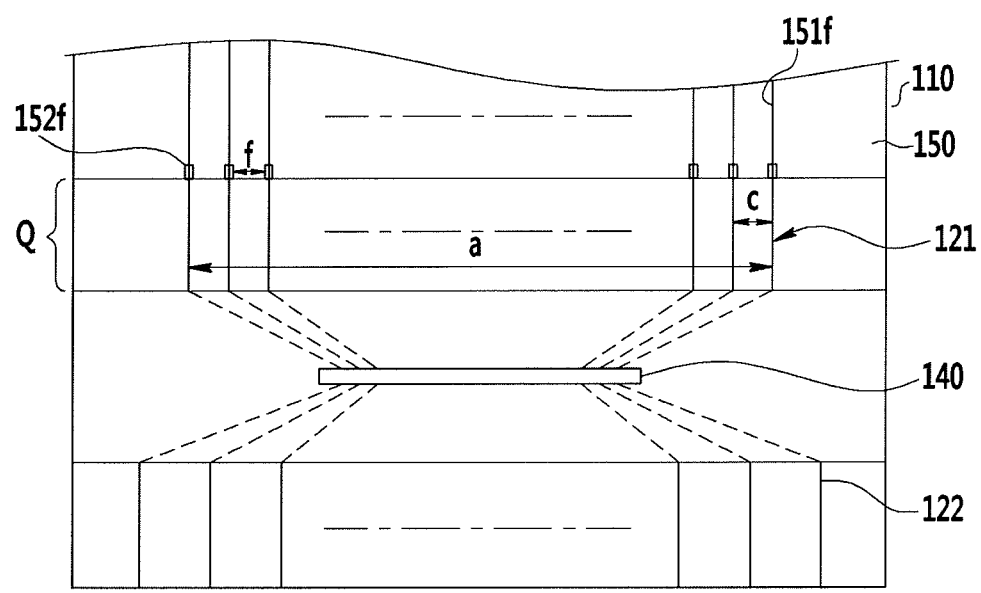
FIG. 4 is a top plan view of a chip on film bonded to a display panel according to a second exemplary embodiment.

In some embodiments, the chip on film is applied to the flexible display device, and the flexible display device includes a display panel 150 and the chip on film electrically connected to the display panel 150, as shown in FIG. 3 and FIG. 4.

The display panel 150 includes wires 151e and 151f electrically connected to the wire part 121 of the chip on film and pad parts 152e and 152f formed at the wires 151e and 151f, and the pad part 152e is electrically connected to the wire part 121 of the second region P.

Here, the display panel 150 may be an organic light emitting display panel or a liquid crystal display panel.

A manufacturing method of the flexible display device may include a process of electrically connecting the chip on film to the display panel.

Also, the display panel 150 includes the pad parts 152e and 152f electrically connected to the chip on film wire part 121, and the pad part is selectively connected to one of the wire of the first region and the wire of the second region by corresponding to the pad parts 152e and 152f.

FIG. 3 shows a manufacturing method of the flexible display device according to the first exemplary embodiment, in which the base film 110 is not cut according to the cutting line formed between the first region Q and the second region P and the pad part 152e and the wire part 121 of the second region P are electrically connected when a plurality of pad parts 152e are formed with the fifth interval e at the display panel 150, a plurality of wires of the second region P are formed with the fourth interval d, and the fifth interval e corresponds to the fourth interval d.

In this case, the cutting line is a substantially straight line passing the wire end of the first region Q.

FIG. 4 shows a manufacturing method of the flexible display device according to the second exemplary embodiment, in which the base film 110 is cut according to the cutting line formed between the first and second regions Q and P and the pad part 152f and the wire part 121 of the first region Q are electrically connected. When a plurality of pad parts 152f are formed at the display panel 150 with the sixth interval f, a plurality of wire parts 121 of the first region Q are formed with the third interval c, and the sixth interval f corresponds to the third interval c.

In this case, the cutting line is a substantially straight line passing the wire end of the first region Q.

According to at least one of the disclosed embodiments, the chip on film of the flexible display device reflects two or more designs to one chip on film, and chips on film having different effects may be selectively used according to the cutting position.

Furthermore, by providing the chip on film of the flexible display device, the chip on film may flexibly correspond to a panel size change that is weak in the bonding process, and furthermore, a loss of the chip on film, that is, a material of the chip on film, equipment operation time, and a loss to separately manage the chip on film may be reduced, thereby increasing work efficiency.

What is claimed is:

1. A chip on film for a flexible display device, comprising:
a base film;
a semiconductor chip formed over the base film;
a wire part formed over the base film and electrically connected to the semiconductor chip; and
a protective layer fully covering the semiconductor chip and partially covering the wire part,
wherein the wire part includes a first region and a second region connected to the first region, wherein a plurality of wires are formed in each of the first and second regions,
wherein a first interval is defined as the distance between two wires that have the greatest distance among the wires located in the first region, wherein a second interval is defined as the distance between two wires that have the greatest distance among the wires located in the second region, and wherein the first interval is different from the second interval.

2. The chip on film of claim 1, wherein the second interval is greater than the first interval.

3. The chip on film of claim 2, wherein at least two of the wires of the first region are spaced apart from each other by a third interval, wherein at least two of the wires of the second region are spaced apart from each other by a fourth interval, and wherein the fourth interval is greater than the third interval.

4. The chip on film of claim 1, wherein a cutting line is formed between the first and second regions.

5. The chip on film of claim 4, wherein the cutting line is formed of a substantially straight line passing a wire end of the first region.

6. A flexible display device comprising:
a display panel; and
a chip on film electrically connected to the display panel, wherein the chip on film comprises:
a base film;
a semiconductor chip formed over the base film;
a wire part formed over the base film and electrically connected to the semiconductor chip; and
a protective layer fully covering the semiconductor chip and partially covering the wire part,
wherein the wire part includes a first region and a second region connected to the first region, wherein a plurality of wires are formed in each of the first and second regions, wherein a first interval is defined as the distance between two wires that have the greatest distance among the wires located in the first region, wherein a second interval is defined as the distance between two wires that have the greatest distance among the wires located in the second region, and wherein the first interval is different from the second interval.

7. The flexible display device of claim 6, wherein the display panel includes a pad part electrically connected to the wire part of the chip on film, and wherein the pad part is electrically connected to the wire of the second region.

8. The flexible display device of claim 6, wherein the display panel is an organic light emitting display panel.

9. The flexible display device of claim 6, wherein the display panel is a liquid crystal display panel.

10. The flexible display device of claim 6, wherein the second interval is greater than the first interval.

11. A manufacturing method of a flexible display device comprising:
electrically connecting a chip on film to a display panel, wherein the display panel comprises a pad part, wherein the chip on film comprises i) a base film, ii) a semiconductor chip formed over the base film, iii) a wire part formed over the base film and electrically connected to the semiconductor chip and iv) a protective layer fully covering the semiconductor chip and partially covering the wire part, wherein the wire part includes a first region and a second region connected to the first region, wherein a plurality of wires are formed in each of the first and second regions, wherein a first interval is defined as the distance between two wires that have the greatest distance among the wires located in the first region, wherein a second interval is defined as the distance between two wires that have the greatest distance among the wires located in the second region, and wherein the first interval is different from the second interval; and
electrically connecting the pad part of the display panel to a wire part of the chip on film, wherein the pad part is selectively connected to one wire of i) the first region and ii) the second region.

12. A manufacturing method of a flexible display device comprising:
electrically connecting a chip on film to a display panel, wherein the display panel comprises a pad part, wherein the chip on film comprises i) a base film, ii) a semiconductor chip formed over the base film and iii) a wire part formed over the base film and electrically connected to the semiconductor chip, wherein the wire part includes a first region and a second region connected to the first region, wherein a plurality of wires are formed in each of the first and second regions, wherein a first interval is defined as the distance between two wires that have the greatest distance among the wires located in the first region, wherein a second interval is defined as the distance between two wires that have the greatest distance among the wires located in the second region, and wherein the first interval is different from the second interval; and electrically connecting the pad part of the display panel to a wire part of the chip on film, wherein the pad part is selectively connected to one wire of i) the first region and ii) the second region, wherein a plurality of wires are formed in the first region, wherein at least two of the wires of the first region are spaced apart from each other by a third interval, a plurality of wires are formed in the pad part, wherein at least two of the wires of the pad part are spaced apart from each other by a fourth interval corresponding to the third interval, wherein the base film is cut according to a cutting line formed between the first region and the second region, and wherein the pad part and the wire of the first region are electrically connected to each other.

13. A manufacturing method of a flexible display device comprising:

electrically connecting a chip on film to a display panel, wherein the display panel comprises a pad part, wherein the chip on film comprises i) a base film, ii) a semiconductor chip formed over the base film and iii) a wire part formed over the base film and electrically connected to the semiconductor chip, wherein the wire part includes a first region and a second region connected to the first region, wherein a plurality of wires are formed in each of the first and second regions, wherein a first interval is defined as the distance between two wires that have the greatest distance among the wires located in the first region, wherein a second interval is defined as the distance between two wires that have the greatest distance among the wires located in the second region, and wherein the first interval is different from the second interval; and electrically connecting the pad part of the display panel to a wire part of the chip on film, wherein the pad part is selectively connected to one wire of i) the first region and ii) the second region, wherein at least two of the wires of the second region are spaced apart from each other by a third interval, a plurality of wires are formed in the pad part, wherein at least two of the wires of the pad part are spaced apart from each other by a fourth interval corresponding to the third interval, wherein the base film is not cut according to a cutting line formed between the first and second regions, and wherein the pad part and the wire of the second region are electrically connected to each other.

14. The manufacturing method of claim 13, wherein the cutting line is formed as a substantially straight line passing a wire end of the first region.

15. The manufacturing method of claim 11, wherein the second interval is greater than the first interval.

16. A flexible display device comprising:
a display panel; and
a chip on film electrically connected to the display panel, wherein the chip on film comprises a wire part electrically connected to a semiconductor chip and a protective layer fully covering the semiconductor chip and partially covering the wire part,
wherein the wire part includes a first region and a second region connected to the first region, wherein a plurality of wires are formed in each of the first and second regions, wherein a first interval is defined as the distance between two wires that have the greatest distance among the wires located in the first region, wherein a second interval is defined as the distance between two wires that have the greatest distance among the wires located in the second region, and wherein the first interval is different from the second interval.

17. The flexible display device of claim 16, wherein the second interval is greater than the first interval.

18. The flexible display device of claim 16, wherein at least two of the wires of the first region are spaced apart from each other by a third interval, wherein at least two of the wires of the second region are spaced apart from each other by a fourth interval, and wherein the fourth interval is greater than the third interval.

19. The flexible display device of claim16, wherein the display panel includes a pad part electrically connected to the wire part of the chip on film, and wherein the pad part is electrically connected to at least one wire of the second region.

20. The chip on film of claim 1, wherein the protective layer comprises a solder resist.

* * * * *